United States Patent
Turner et al.

(10) Patent No.: US 8,773,192 B2
(45) Date of Patent: Jul. 8, 2014

(54) OVERSHOOT SUPPRESSION FOR INPUT/OUTPUT BUFFERS

(71) Applicant: LSI Corporation, Milpitas, CA (US)

(72) Inventors: Mark F. Turner, Longmont, CO (US); Jay Daugherty, Longmont, CO (US); Jeff S. Brown, Fort Collins, CO (US); Marek J. Marasch, Longmont, CO (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/688,001

(22) Filed: Nov. 28, 2012

(65) Prior Publication Data

US 2014/0145775 A1    May 29, 2014

(51) Int. Cl.
*H03L 5/00*    (2006.01)

(52) U.S. Cl.
USPC .......................... 327/309; 327/321

(58) Field of Classification Search
USPC ................. 327/306, 309, 320–321
See application file for complete search history.

(56) References Cited

U.S. PATENT DOCUMENTS

| 5,027,040 | A | * | 6/1991 | Ikeda et al. | 315/241 R |
| 5,034,629 | A | | 7/1991 | Kinugasa et al. | |
| 5,182,220 | A | | 1/1993 | Ker et al. | |
| 5,289,334 | A | | 2/1994 | Ker et al. | |
| 5,440,162 | A | | 8/1995 | Worley et al. | |
| 5,440,163 | A | | 8/1995 | Ohhashi | |
| 5,568,062 | A | | 10/1996 | Kaplinsky | |
| 6,294,941 | B1 | * | 9/2001 | Yokosawa | 327/309 |
| 6,657,241 | B1 | | 12/2003 | Rouse et al. | |
| 6,747,501 | B2 | * | 6/2004 | Ker et al. | 327/310 |
| 2010/0102856 | A1 | * | 4/2010 | Yamada | 327/109 |

* cited by examiner

*Primary Examiner* — Dinh T. Le
(74) *Attorney, Agent, or Firm* — William W. Cochran; Cochran Freund & Young LLC

(57) ABSTRACT

Disclosed is a diode clamping circuit that is used in an I/O buffer to suppress noise. Diode-connected CMOS transistors or PN junction transistors are utilized, which are native to the CMOS process. Switching circuitry is also disclosed to isolate the diodes and prevent current drain in the circuit. Switching circuitry is also used to switch between two different power supply voltages.

4 Claims, 5 Drawing Sheets

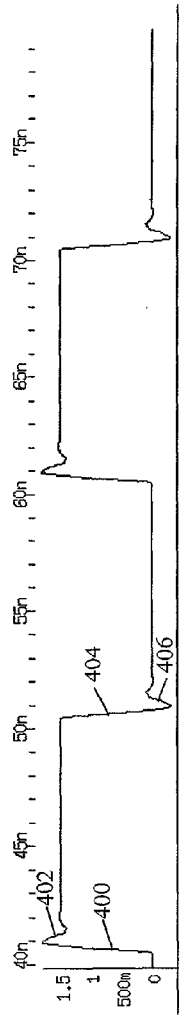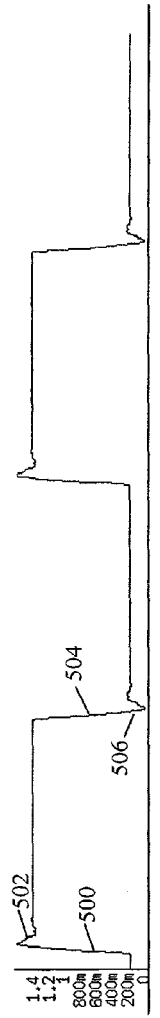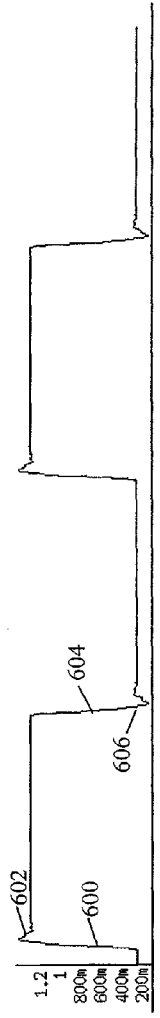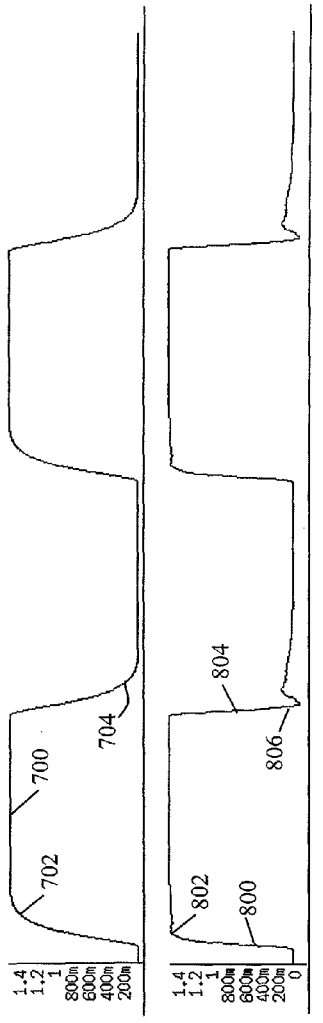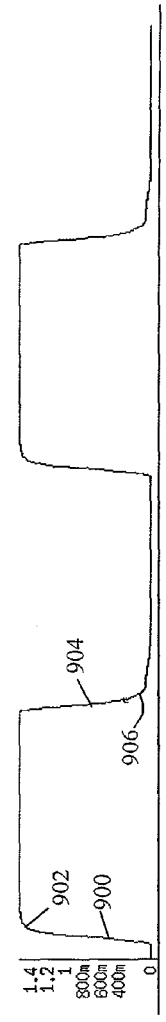
Fig. 4
Fig. 5
Fig. 6
Fig. 7
Fig. 8
Fig. 9

US 8,773,192 B2

OVERSHOOT SUPPRESSION FOR INPUT/OUTPUT BUFFERS

BACKGROUND

CMOS technology has resulted in substantial economies in the semi-conductor market. Logic and control circuits based on CMOS circuits are effective, efficient and economical semiconductor devices.

SUMMARY OF THE INVENTION

An embodiment of the present invention may therefore comprise a method of clamping an input signal applied to an input of a CMOS circuit to a positive supply voltage to control overshoot of the input signal comprising: connecting a cathode of a first diode to the input of the CMOS circuit; connecting an anode of the first diode to a bias voltage that is substantially equal to the positive supply voltage minus a first predetermined voltage; connecting an anode of an second diode to the input of the CMOS circuit; connecting a cathode of the second diode to a second bias voltage that is equal to a second predetermined voltage.

An embodiment of the present invention may further comprise a clamping circuit for clamping an input signal that is applied to an input of a CMOS circuit that suppresses overshoot of the input signal comprising: a first diode having an anode that is connected to the input of the CMOS circuit and a cathode that is connected to a first bias voltage that is substantially equal to a supply voltage for the CMOS circuit minus a first predetermined voltage; a second diode having a cathode that is connected to the input of the CMOS circuit and an anode that is connected to a second predetermined voltage.

BRIEF DESCRIPTION OF THE DRAWINGS

FIG. 4 is a graph of a typical input signal showing overshoot.

FIG. 5 is a graph of an input signal with a 150 ohm on-die termination.

FIG. 6 is a graph of an input signal with a 75 ohm on-die termination.

FIG. 7 is a graph of an input signal that is applied to the diode clamp of FIG. 1A.

FIG. 8 is a graph of an input signal that is applied to the actively controlled diode clamp of FIG. 2.

FIG. 9 is a graph of an input signal that is applied to the actively controlled diode clamp with alternative supply voltages of FIG. 3.

DETAILED DESCRIPTION OF THE EMBODIMENTS

Figure 1A:
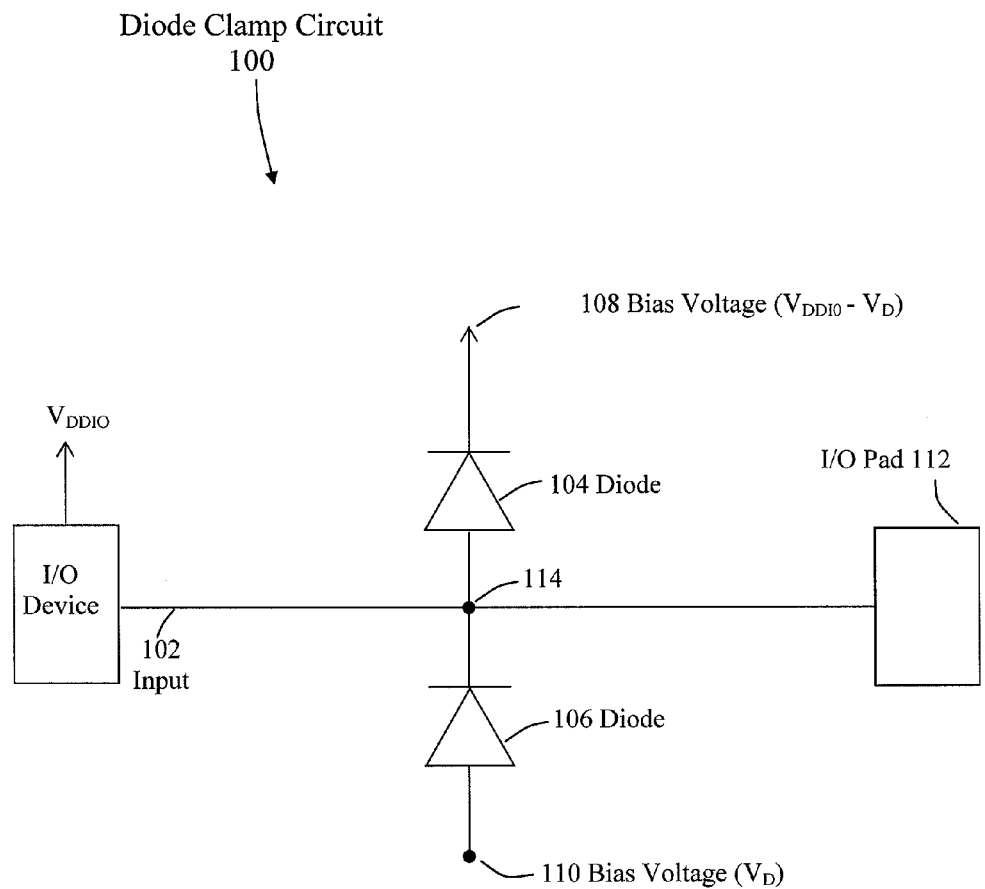
FIG. 1A is a schematic circuit diagram illustrating a first embodiment of the present invention.

FIG. 1A is a schematic circuit diagram of a diode clamp circuit 100. As illustrated in FIG. 1A, an input signal 102 is applied to the diode clamp circuit 100, which resides between the input 102 and the input/output (I/O) pad 112. The diode clamp circuit 100 is intended to reduce overshoot of an input signal that is applied to the input/output pad 112. The diode clamp circuit 100 causes diodes 104, 106 to conduct at a voltage level that will prevent an overshoot of the input signal and reduce noise in the circuitry connected to the input/output pad 112.

Typically, Schottky-type diodes have been used as clamping diodes 104, 106 for on-chip noise reduction. However, Schottky diodes are not native to many CMOS processes. Therefore, Schottky diodes may require an additional processing step, which drives up the cost of the chip. For this reason, the use of Schottky diodes on the chip for noise reduction is not a desirable solution and does not provide adjustment for shaping waveforms. Further, the use of CMOS diodes for noise reduction, including overshoot, has not been effective, since the threshold voltage to turn on the CMOS diodes may be on the order of 0.5 volts to 0.9 volts, depending on the particular process. The high threshold voltages required to turn on CMOS diodes is essentially the result of the thin structures used in many CMOS processes. As such, CMOS diodes do not function effectively for the purpose of reducing overshoot. For example, in a typical CMOS process, $V_{DD}$ may equal 1.5 volts. If the threshold (turn-on) voltage of the diode is 0.5 volts, the diode will not turn on until the input signal reaches 2 volts. As such, the overshoot can be as much as 0.5 volts before a CMOS diode would turn on. In such an example, standard CMOS diodes do not provide any protection for overshoot and I/O circuitry can be damaged.

Figure 1B:
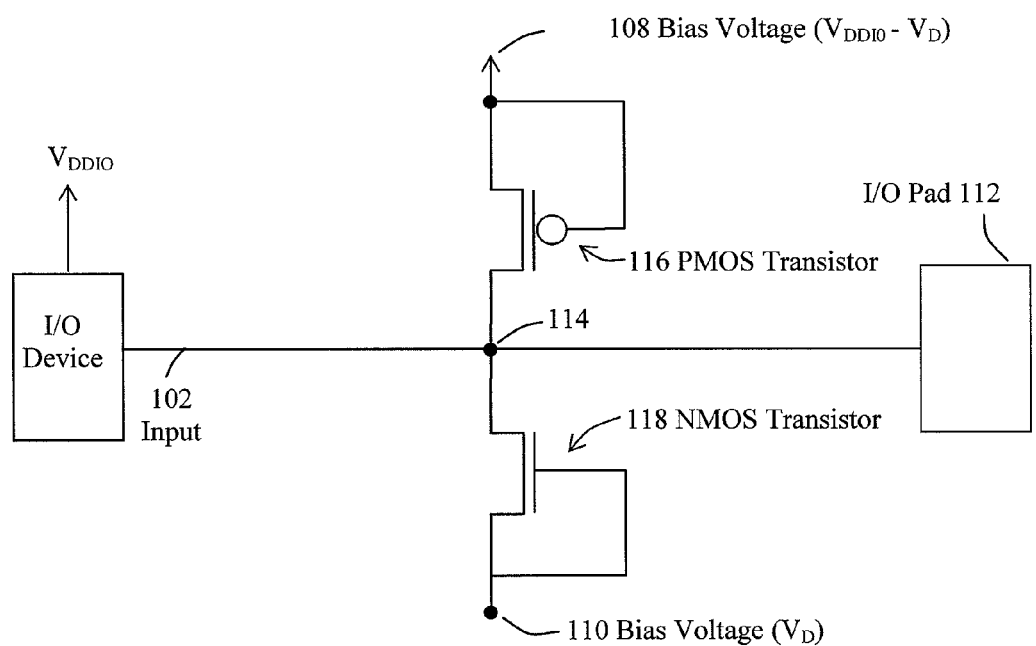
FIG. 1B is a schematic circuit diagram of the circuit of FIG. 1A using diode-connected CMOS devices.

The circuit of FIG. 1A overcomes these disadvantages by adjusting the bias voltage for diode 104 and diode 106. The diodes may comprise NP junction diodes or diode-connected CMOS devices. In some cases, diode-connected CMOS devices are easier than a PN junction diode to integrate into the design in a CMOS process. A typical diode-connected CMOS device is shown in FIG. 1B. As illustrated in FIG. 1A, the bias voltage 108 of diode 104 is equal to $V_{DDIO}-V_D$. $V_{DDIO}$ is the supply voltage for the input/output device connected to I/O pad 112. In one example, $V_{DDIO}$ may be 1.5 volts. An additional voltage, $V_D$, is generated, which is subtracted from $V_{DDIO}$. $V_D$ may be equal or near the threshold voltage of diode 104, in one example, and will be assumed to be 0.5 volts in the examples discussed herein. In that case, the bias voltage 108 for diode 104 would be 1 volt, which is the $V_{DDIO}$ voltage (1.5 volts) minus $V_D$ (0.5 volts), which, in this example, is also the threshold voltage. Accordingly, the bias voltage 108 of diode 104 is 1 volt. Assuming that the input 102 starts at zero volts and transitions to 1.5 volts, the diode 104, in this example, will turn on at 1.5 volts, which is equal to the bias voltage (1 volt) plus the threshold voltage (0.5 volts). In this fashion, diode 104 clamps the voltage at node 114 at 1.5 volts.

As also illustrated in FIG. 1A, diode 106 is biased at $V_D$ (0.5 volts) at node 110. Assuming the input 102 is high, which is 1.5 volts in the example given above, the voltage at node 114 is 1.5 volts and diode 106 is off. When the input signal 102 transitions to zero volts, diode 106 turns on when $V_D$ (0.5 volts) is greater than the voltage at node 114 by an amount that is equal to the threshold voltage (0.5 volts) of diode 106. Accordingly, diode 106 turns on at zero volts, since the voltage drop across diode 106 reaches the threshold voltage of diode 106 when the voltage at node 114 reaches zero volts.

The example given above is simply one example of one process that can be used in which $V_D$ is equal to the threshold voltage of diode 104 and diode 106. However, the diode clamp circuit 100 of FIG. 1A can be tuned to obtain various results by adjusting $V_D$. By adjusting $V_D$, the timing of when diode 104 and diode 106 turn on during the pulse transition of input 102 can be adjusted to suppress overshoot and shape the input signal 102. For example, if the threshold voltage of diode 104 and diode 106 is 0.5 volts, it may be desirable to use a voltage of 0.6 volts for $V_D$ to cause diode 104 and diode 106 to turn on earlier, which may further eliminate any overshoot of input signal 102. Hence, the voltage $V_D$ can be selected to tune the diode clamping circuit 100 so that the turn-on voltage of diode 104 and diode 106 can be modified to obtain the desired waveform shape. Further, the voltage $V_D$ that is applied to diode 106 can be different from the $V_D$ that is subtracted from $V_{DDIO}$ that is used to bias diode 104. Of course, the bias voltage $V_D$ can be generated in various ways on the chip to provide a convenient source for the bias voltage $V_D$.

The circuit of FIG. 1A is therefore simple and easy to implement, since process techniques that form other portions of the circuit can be used to construct diodes 104, 106. As pointed out above, both PN junction diodes and diode-connected CMOS transistors can be used. Both the PN junction diodes and the diode-connected CMOS transistors are native to many CMOS processes, which allows either type of diode to be utilized in the schematic configuration illustrated in FIG. 1A.

FIG. 1B is a schematic circuit diagram of the circuit of FIG. 1A using diode-connected CMOS transistors. As shown in FIG. 1B, the input signal 102 is applied to the node 114. PMOS transistor 116 conducts when the bias voltage 108 ($V_{DDIO}-V_D$) is less than the input signal voltage at node 114 minus the threshold voltage of PMOS transistor 116. NMOS transistor 118 conducts when the bias voltage 110 ($V_D$) is greater than the voltage of the input signal 102 at node 114. In this manner, PMOS transistor 116 functions in the same manner as diode 104, while NMOS transistor 118, in the circuit configuration of FIG. 1B, functions as diode 106. Node 114 is connected to the I/O pad 112.

Although the circuitry of FIGS. 1A and 1B is simple and easy to manufacture, current drain occurs when diodes 104, 106 are forward biased. This current drain may be unacceptable in many implementations.

Figure 2:
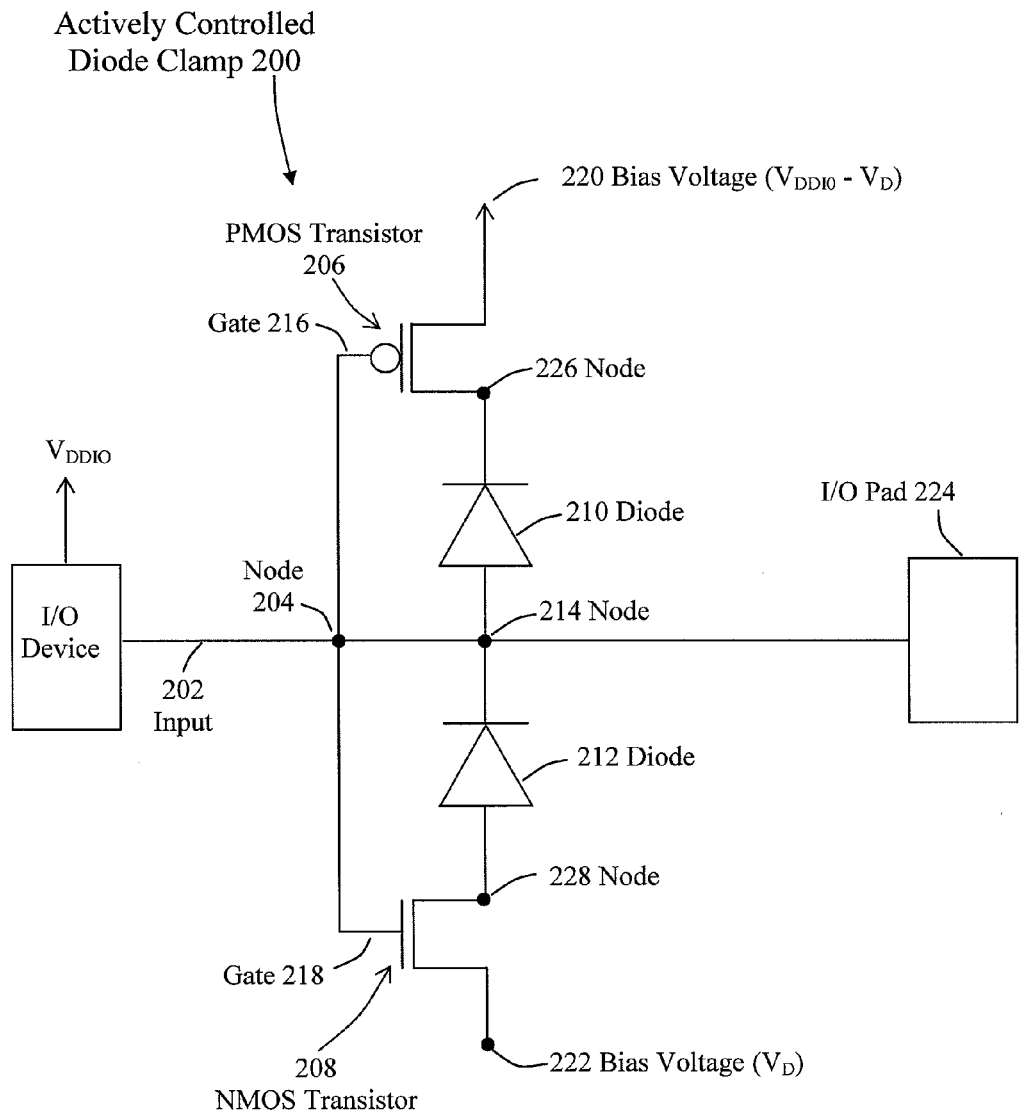
FIG. 2 is a schematic diagram of a second embodiment of the invention.

FIG. 2 is a schematic diagram of an actively controlled diode clamp 200 that isolates diodes 210, 212 to prevent current drain. As illustrated in FIG. 2, in the example given above, just prior to the time at which the input 202 switches from zero to 1.5 volts, the node 204 is at zero volts. As such, PMOS transistor 206 is on because the zero voltage signal is applied to gate 216 of PMOS transistor 206. In that regard, the bias voltage 220, which is equal to $V_{DDIO}$ appears at node 226. Similarly, the zero voltage signal is applied to gate 218 of NMOS transistor 208, so that NMOS transistor 208 is off. As such, there is no leakage current through diode 212 because NMOS transistor 208 is off. When the input 202 goes high, gate 216 goes high and turns off PMOS transistor 206. Node 226 is precharged with a bias voltage 220, which is $V_{DDIO}-V_D$. As soon as the input signal 202 reaches a voltage level equal to $V_{DDIO}-V_D$ (1.0 volts) plus the threshold voltage of diode 210 (0.5 volts), diode 210 begins to conduct. The voltage on node 226, which is preloaded to equal the bias voltage 220 ($V_{DDIO}-V_D$) (1.0 volts) plus the threshold voltage of the diode 210 (0.5 volts), which is 1.5 volts, is applied to node 214. In that manner, overshoot is eliminated, especially if $V_D$ is equal or nearly equal to the threshold voltage of diode 210.

Considering diode 212 of FIG. 2 during a positive going pulse, the NMOS transistor 208 turns on as the input voltage of 1.5 volts is applied to gate 218. When NMOS transistor 208 is on, the voltage at node 214 is at a logic 1 (e.g., 1.5 volts). Diode 212 is reversed biased since the bias voltage 222 ($V_D$) is 0.5 volts in the present example. Diode 212 is reversed biased and is off because the input signal at logic 1 ($V_{DDIO}$) is equal to 1.5 volts and bias voltage 222 ($V_D$) is at 0.5 volts in the present example. Since node 226 is preloaded to a voltage equal to the bias voltage 220 ($V_{DDIO}-V_D$) (1.0 volts), overshoot on the positive going pulse is suppressed.

Considering the negative going pulse, when the input signal 202 is high ($V_{DDIO}$), e.g., 1.5 volts, and transitions to a logic 0, e.g., zero volts, node 228 is preloaded to bias voltage 222 ($V_D$), which is 0.5 volts, since NMOS transistor 208 has been on while the input signal 202 has been high (e.g., 1.5 volts). As the input signal 202 drops, NMOS transistor 208 transitions to an off condition and diode 212 begins to conduct when the voltage of the input signal 202 is equal to the preloaded voltage on node 228 ($V_D$), e.g., 0.5 volts minus the threshold voltage of diode 212 (e.g., 0.5 volts), which is zero volts. In this manner, overshoot of the negative going pulse is suppressed by the preloaded voltage on node 228. At the same time, FIG. 2 illustrates that when the input signal 202 reaches zero volts, PMOS transistor 206 turns on and diode 210 turns off, since diode 210 is reverse biased, because bias voltage 220 ($V_{DDIO}-V_D$), e.g., 1 volt, is greater than the voltage of the input signal 202, e.g., zero volts.

Consequently, the circuit of FIG. 2 functions such that PMOS transistor 206 acts as a switch to isolate the input signal 202 at node 214 when the input signal 202 is greater than the bias voltage 220 to prevent a current drain. In addition, NMOS transistor 208 isolates the input signal 202 at node 214 when the voltage of the input signal 202 at node 214 is less than bias voltage 222 to prevent current drain through diode 212.

Figure 3:
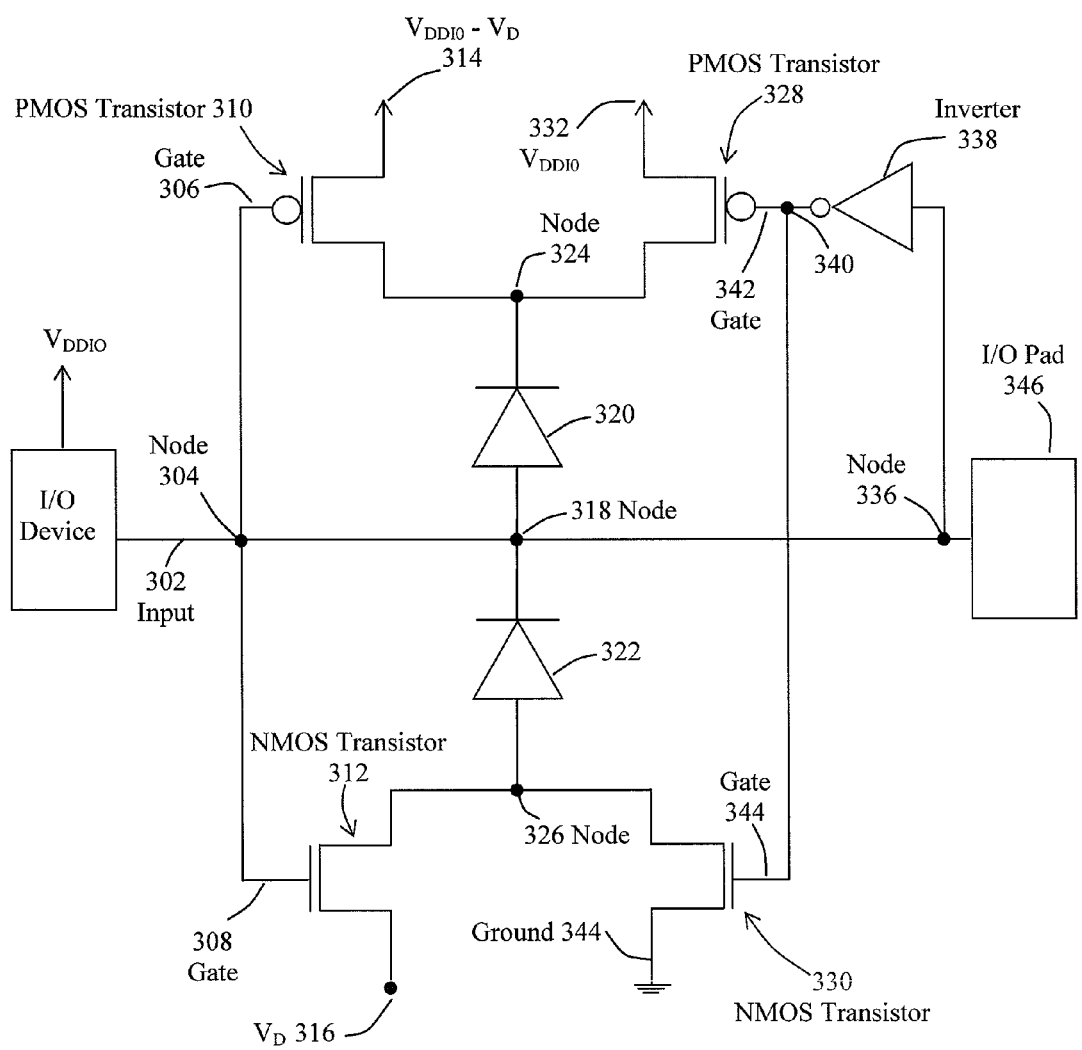
FIG. 3 is a schematic diagram of a third embodiment of the invention.

FIG. 3 is a schematic illustration of an embodiment of an actively controlled diode clamp 300 with alternative supply voltages. As illustrated in FIG. 3, a pair of diodes 320, 322 are connected to the input signal 302. Again, in this example, for the purposes of explanation, the input signal is zero volts at a logic 0 and 1.5 volts at a logic 1. In addition, $V_D$ is equal to 0.5 volts and $V_{DDIO}$ is equal to 1.5 volts. Further, the threshold voltage of diodes 320, 322 is approximately 0.5 volts. As illustrated in FIG. 3, when the input signal is at zero volts, PMOS transistor 310 is on and preloads node 324 to the supply voltage 314 ($V_{DDIO}-V_D$), e.g., 1 volt. The zero voltage of the input signal 302 also appears at node 336. Inverter 338 inverts the zero voltage signal to 1.5 volts at node 340, which is applied to gate 344 to turn on NMOS transistor 330. When NMOS transistor 330 is turned on, node 326 is at ground potential 344 (zero volts). In addition, NMOS transistor 312 is off, since the voltage of the input signal 302 is zero volts. Accordingly, diode 322 has an anode connected to node 318 that is at zero volts and a cathode connected at node 326, which is at zero volts. Further, PMOS transistor 328 is off and the supply voltage 332 ($V_{DDIO}$) is isolated from node 324.

When the input signal 302 of FIG. 3 transitions to 1.5 volts, PMOS transistor 310 turns off and NMOS transistor 312 turns on. Further, NMOS transistor 330 turns off and PMOS transistor 328 turns on. The voltage at node 318 increases to 1.5 volts as a result of the rise in the voltage of the input signal 302. Node 324 is precharged to $V_{DDIO}-V_D$ and transitions to the supply voltage 332 ($V_{DDIO}$) as PMOS transistor 328 turns on. As such, diode 320 will conduct initially if the input signal 302 exceeds 1.5 volts, so as to prevent overshoot, since node 324 is precharged to supply voltage 314 ($V_{DDIO}-V_D$). Simultaneously, NMOS transistor 312 turns on and the voltage at node 326 increases to supply voltage 316 ($V_D$). PMOS transistor 328 also turns on. The voltage on node 324 increases to the supply voltage 332 ($V_{DDIO}$). Node 324 is preloaded to the supply voltage 314, which is $V_{DDIO}-V_D$, since PMOS transistor 310 is on prior to the time that the node 304 goes high. As the input signal 302 transitions to 1.5 volts, overshoot is suppressed by the preloaded 1.0 volt on node 324, since there is a voltage drop of 0.5 volts across diode 320. In addition, the high going input signal 302 turns on the PMOS transistor 328, which connects the supply voltage 332 ($V_{DDIO}$) to node 324. Accordingly, $V_{DDIO}$ is present on node 324, as well as node 318 when the input signal 302 is high, and as such, there is no current drain through diode 320.

When the input signal 302 transitions from a high to a low signal (i.e., from 1.5 volts to zero volts), PMOS transistor 310 turns on and PMOS transistor 328 turns off. The voltage on node 324 transitions from supply voltage 332 ($V_{DDIO}$) to supply voltage 314 ($V_{DDIO}-V_D$). Simultaneously, NMOS transistor 312 turns off while NMOS transistor 330 turns on, which transitions the voltage at node 326 from $V_D$ (0.5 volts) to ground 344. Node 326 has been precharged to supply voltage 316 ($V_D$), which is reflected as zero volts at node 318 because of the threshold voltage drop of 0.5 volts of diode 322. Accordingly, as the input signal 302 drops, overshoot below zero volts is suppressed, since node 326 was precharged to $V_D$ (0.5 volts), which precharged node 318 to zero volts. Node 326 then transitions to supply voltage 344, which is ground or zero volts, since NMOS transistor 330 is on. Accordingly, there is no voltage drop across diode 322, since node 318 is at zero volts and node 326 is at zero volts. As such, there is no current drain.

FIG. 4 is a schematic illustration of a simulation of an input signal having no overshoot suppression. As illustrated in FIG. 4, there is an overshoot 402 on the positive going transition 400 and a negative overshoot 406 on the negative going transition 404. These overshoots create noise in the signal and can actually harm the I/O circuitry connected to the I/O pad.

FIG. 5 is an illustration of a simulation of an input signal with a 150 ohm on-die termination. On-die termination is a technique in which a resistive termination is located within the chip. Typically, the values of the internal resistances for DDR2 are 150 ohm, 75 ohm and 50 ohm. On-die termination values for DDR3 are 120 ohm, 60 ohm and 40 ohm. FIG. 5 illustrates a 150 ohm on-die termination in a DDR2 process. As shown, the overshoot 502 of the rising signal 500 is less than the overshoot 402 illustrated in FIG. 4. Similarly, the overshoot 506 of the down going signal 504 is less than the overshoot 406, where no on-die termination is provided.

FIG. 6 is an illustration of a simulation of a 75 ohm on-die termination. As illustrated in FIG. 6, the overshoot 602 of the rising signal 600 is smaller for the 75 ohm on-die termination. Similarly, the overshoot 606 of the negatively going signal 604 is smaller.

FIG. 7 is a schematic illustration of a simulation of a plot of an input signal 700 for the diode clamp illustrated in FIG. 1A. As shown in FIG. 7, the simulated input signal 700 does not reflect any overshoot or ringing of the signal. However, FIG. 7 shows slower edges 702, 704 that are not as steep as the signals illustrated in FIGS. 4-6.

FIG. 8 is a simulated plot of the waveforms resulting from the actively controlled clamping diodes of FIG. 2. As shown in FIG. 8, the edge 802 of the rising pulse 800 is square and has literally no overshoot. The falling edge 804 has an overshoot 806.

FIG. 9 is a plot of a simulated response of an input signal that is applied to an actively controlled diode clamp with alternative supply voltages, such as illustrated in FIG. 3. As shown in FIG. 9, the rising pulse 902 has a fast edge 902, while the falling pulse 904 has a fast edge 906. Both of the corners 902, 906 do not demonstrate any ringing or overshoot.

Accordingly, overshoot can be controlled by diode clamping, so as to reduce or eliminate overshoot and ringing. The controlled clamp waveforms illustrated in FIGS. 8 and 9, which correspond to the circuits of FIGS. 2 and 3, have faster edges. The on-die termination schemes, illustrated in FIGS. 5 and 6, consume milliamps of current when active. The uncontrolled diode clamping, illustrated in FIGS. 1 and 7, consume less RMS current than on-die termination schemes, but current also flows during the high and low steady state conditions. The actively controlled clamping circuits of FIGS. 2 and 3, which are illustrated in FIGS. 8 and 9, reduce the RMS current and eliminate most of the current flowing during the steady state portions of the pulse.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A clamping circuit for clamping an input signal that is applied to an input of a CMOS circuit that suppresses overshoot of said input signal comprising:

a first CMOS diode having an anode that is connected to said input of said CMOS circuit and a cathode that is connected to a first bias voltage that is substantially equal to a supply voltage for said CMOS circuit minus a first voltage that is approximately equal to a threshold voltage of said first CMOS diode;

a second CMOS diode having a cathode that is connected to said input of said CMOS circuit and an anode that is connected to a second voltage that is approximately equal to a threshold voltage of said second CMOS diode;

a first PMOS transistor that connects said anode of said first CMOS diode to said first bias voltage when said input transitions from a high voltage to a low voltage and disconnects said anode of said first CMOS diode from said first bias voltage when said input signal transitions from said low voltage to said high voltage;

a second PMOS transistor that connects said anode of said first CMOS diode to a third bias voltage that is substantially equal to said positive supply voltage when said input signal transitions from said low voltage to said high voltage, and disconnects said anode of said first CMOS diode from said third bias voltage when said input signal transitions from said high voltage to said low voltage;

a first NMOS transistor that connects a cathode of said second CMOS diode to said second voltage, when said input signal transitions from said low voltage to said high voltage, and disconnects said cathode of said second CMOS diode from said second voltage, when said input signal transitions from said high voltage to said low voltage;

a second NMOS transistor that connects said cathode of said second CMOS diode to a fourth bias voltage that is substantially equal to a negative supply voltage, when said input signal transitions from said high voltage to said low voltage, and disconnects said cathode of said second CMOS diode from said fourth bias voltage when said input signal transitions from said low voltage to said high voltage.

2. The clamping circuit of claim 1 wherein said positive supply voltage is a positive voltage and said negative supply voltage is zero volts.

3. The clamping circuit of claim 1 wherein said positive supply voltage is a positive voltage and said negative supply voltage is a negative voltage.

4. The clamping circuit of claim 1 wherein said positive supply voltage is zero volts and said negative supply voltage is a negative voltage.

* * * * *